(12) United States Patent
Fan et al.

(10) Patent No.: US 10,537,042 B2
(45) Date of Patent: Jan. 14, 2020

(54) ELECTRONIC DEVICE WITH HEAT-DISSIPATING FUNCTION AND LIQUID-COOLING RADIATOR MODULE THEREOF

(71) Applicant: AURAS Technology Co., Ltd., New Taipei (TW)

(72) Inventors: Mu-Shu Fan, New Taipei (TW); Chien-Yu Chen, New Taipei (TW)

(73) Assignee: AURAS TECHNOLOGY CO., LTD., New Taipei (TW)

( * ) Notice: Subject to any disclaimer, the term of this patent is extended or adjusted under 35 U.S.C. 154(b) by 81 days.

(21) Appl. No.: 15/679,630

(22) Filed: Aug. 17, 2017

(65) Prior Publication Data

US 2018/0255662 A1 Sep. 6, 2018

Related U.S. Application Data

(60) Provisional application No. 62/465,213, filed on Mar. 1, 2017.

(51) Int. Cl.
*H05K 7/20* (2006.01)
*G06F 1/20* (2006.01)
(Continued)

(52) U.S. Cl.
CPC ....... *H05K 7/20272* (2013.01); *F04D 17/025* (2013.01); *F04D 17/16* (2013.01); *F04D 19/002* (2013.01); *F04D 25/0613* (2013.01); *F04D 29/526* (2013.01); *F04D 29/582* (2013.01); *G06F 1/20* (2013.01); *H05K 7/20154* (2013.01);
(Continued)

(58) Field of Classification Search
CPC .......... H05K 7/20272; H05K 7/20263; H05K 7/20218; H05K 7/20154; G06F 1/20; F04D 17/025; F04D 17/16; F04D 29/582; F04D 29/526; F04D 25/0613; F04D 19/002; H01L 23/473
See application file for complete search history.

(56) References Cited

U.S. PATENT DOCUMENTS 6,330,908 B1 * 12/2001 Lee ..................... H01L 23/467
165/185
7,154,749 B2 * 12/2006 Stefanoski ............... G06F 1/20
361/695

(Continued)

*Primary Examiner* — Mukundbhai G Patel
*Assistant Examiner* — Zhengfu J Feng
(74) *Attorney, Agent, or Firm* — WPAT, PC

(57) ABSTRACT

An electronic device with a heat-dissipating function and a liquid-cooling radiator module are provided. The electronic device includes a first circuit board, a second circuit board and a liquid-cooling radiator module. The second circuit board is mounted on the first circuit board. The liquid-cooling radiator module is attached on the second circuit board and in thermal contact with an electronic component of the second circuit board. The liquid-cooling radiator module includes plural airflow channels and a fan. The plural airflow channels are in parallel with the second circuit board. The fan produces airflow toward the plural airflow channel. After the airflow passes through the plural airflow channels, the airflow is outputted in a direction parallel with the second circuit board. Since the airflow is not obstructed by the adjacent function circuit boards, the heat-dissipating efficiency is enhanced.

19 Claims, 9 Drawing Sheets

(51) Int. Cl.
    *F04D 17/16*     (2006.01)
    *F04D 29/52*     (2006.01)
    *F04D 29/58*     (2006.01)
    *F04D 19/00*     (2006.01)
    *F04D 17/02*     (2006.01)
    *F04D 25/06*     (2006.01)
    *H01L 23/473*     (2006.01)

(52) U.S. Cl.
    CPC ..... H05K 7/20218 (2013.01); H05K 7/20263 (2013.01); *H01L 23/473* (2013.01)

(56) References Cited

U.S. PATENT DOCUMENTS

| | | | | |
|---|---|---|---|---|
| 2005/0150643 | A1* | 7/2005 | Chartouni | F28D 1/0233 165/156 |
| 2005/0243511 | A1* | 11/2005 | Hata | G06F 1/203 361/679.47 |
| 2006/0196643 | A1* | 9/2006 | Hata | G06F 1/1616 165/104.33 |
| 2006/0279930 | A1* | 12/2006 | Hata | G06F 1/203 361/697 |
| 2009/0080162 | A1* | 3/2009 | Lin | H05K 1/0204 361/720 |
| 2015/0070837 | A1* | 3/2015 | Hsu | G06F 1/20 361/679.47 |
| 2015/0292817 | A1* | 10/2015 | Shimanuki | F28F 3/025 165/173 |

* cited by examiner

ELECTRONIC DEVICE WITH HEAT-DISSIPATING FUNCTION AND LIQUID-COOLING RADIATOR MODULE THEREOF

FIELD OF THE INVENTION

The present invention relates to an electronic device with a heat-dissipating function and a liquid-cooling radiator module, and more particularly to an electronic device using a liquid-cooling medium to dissipate heat and a liquid-cooling radiator module.

BACKGROUND OF THE INVENTION

With increasing development of science and technology, the processing speed of a computing chip for an electronic device is gradually increased. Consequently, a great amount of waste heat is generated while the computing chip is operated. It is a critical issue to dissipate the heat. For example, a computer host comprises a main board and a display card. The display card is mounted on the main board. Generally, the chip of the display card generates more heat than the main board. Consequently, the heat generated by the chip of the display card has to be dissipated in high priority.

However, for most electronic devices, plural function circuit boards are mounted on the main board in parallel and arranged side by side. Since the airflow for convection is usually obstructed by the adjacent function circuit boards, the heat generated by the chip of the display card cannot be efficiently dissipated away by the existing heat-dissipating mechanism. Therefore, the heat-dissipating mechanism of the electronic device needs to be further improved.

SUMMARY OF THE INVENTION

For solving the drawbacks of the conventional technologies, the present invention provides an electronic device with a heat-dissipating function and a liquid-cooling radiator module. Since the airflow is not obstructed by the adjacent function circuit board, the heat-dissipating efficiency is enhanced.

In accordance with an aspect of the present invention, there is provided an electronic device with a heat-dissipating function. The electronic device includes a first circuit board, a second circuit board and a liquid-cooling heat dissipation module. The second circuit board is mounted on the first circuit board. The circuit board includes an electronic component. A liquid-cooling medium flows within the liquid-cooling heat dissipation module to dissipate heat. The liquid-cooling heat dissipation module includes a liquid-cooling head, a liquid-cooling radiator module and a liquid pump. The liquid-cooling head is in thermal contact with the electronic component of the second circuit board. The liquid-cooling radiator module includes a liquid-cooling radiator, plural fins and a fan. The liquid-cooling radiator is in communication with the liquid-cooling head and includes an annular wall structure. The annular wall structure includes at least one liquid passageway, an inlet and an outlet. The inlet and the outlet are respectively located at two ends of the liquid airflow channel. The liquid-cooling medium from the liquid-cooling head is introduced into the liquid-cooling radiator through the inlet. Moreover, plural airflow channels are defined by the plural fins and the annular wall structure collaboratively. The plural airflow channels are in parallel with the second circuit board. The fan is arranged beside the liquid-cooling radiator, and the fan produces airflow toward the plural airflow channels. The liquid pump is in communication with the liquid-cooling radiator. The liquid-cooling medium from the outlet of the liquid-cooling radiator is sucked into the liquid pump. The liquid-cooling medium is propelled form the liquid pump to the liquid-cooling radiator.

In an embodiment, the annular wall structure of the liquid-cooling radiator has a C-shaped periphery, a corner-shaped periphery or an irregular curvy periphery.

In an embodiment, the annular wall structure of the liquid-cooling radiator has a triangular periphery, a rectangular periphery, a circular periphery, a polygonal periphery or an irregular periphery.

In an embodiment, the liquid-cooling radiator further includes a central region, and the annular wall structure is arranged around the central region. A width of each fin close to the central region is narrower than a width of each fin away from the central region. The plural fins are connected with each other and arranged in a radiating form.

In an embodiment, the fan is a centrifugal fan. The centrifugal fan is disposed within the central region of the liquid-cooling radiator. The centrifugal fan produces the airflow toward the plural airflow channels in a centrifugal direction.

In an embodiment, the fan is a centrifugal/axial mixed fan. The centrifugal/axial mixed fan is disposed within the central region of the liquid-cooling radiator. The centrifugal/axial mixed fan produces the airflow in a centrifugal direction and an axial direction simultaneously.

In an embodiment, the centrifugal/axial mixed fan includes plural blades, and each of the plural blades has an S-shape curvy profile.

In an embodiment, the inlet and the outlet of the liquid-cooling radiator are formed in a lateral surface of the liquid-cooling radiator and arranged beside each other. The inlet and the outlet are vertically arranged in a staggered form, or the inlet and the outlet are horizontally arranged side by side.

In an embodiment, the at least one liquid passageway includes plural annular passageways. After the liquid-cooling medium is introduced into the liquid-cooling radiator through the inlet, the liquid-cooling medium is distributed into the plural annular passageways. After the liquid-cooling medium flows through the plural annular passageways for one turn and before the liquid-cooling medium flows to the outlet, the liquid-cooling medium is collected and exhausted through the outlet.

In an embodiment, the liquid-cooling radiator includes at least one flow-guiding plate. The liquid-cooling medium in the at least one liquid passageway is guided from a lower level to a higher level by the at least one flow-guiding plate.

In an embodiment, the inlet of the liquid-cooling radiator is located at a level lower than the outlet of the liquid-cooling radiator. The at least one liquid passageway between the inlet and the outlet has an upward spiral shape.

In accordance with another aspect of the present invention, there is provided a liquid-cooling radiator module for allowing a liquid-cooling medium to flow through to dissipate heat. The liquid-cooling radiator module includes a liquid-cooling radiator, plural fins and a fan. The liquid-cooling radiator includes an annular wall structure and a central region. The annular wall structure is arranged around the central region. The annular wall structure includes at least one liquid passageway, an inlet and an outlet. The inlet and the outlet are respectively located at two ends of the liquid airflow channel. The liquid-cooling medium is introduced into the at least one liquid passageway through the inlet. The at least one liquid passageway is outputted from the at least one liquid passageway through the outlet. The plural fins are connected with the liquid-cooling radiator. Moreover, plural airflow channels are defined by the plural fins and the annular wall structure collaboratively. The plural airflow channels are arranged in a radiating form in a centrifugal direction away from the central region of the liquid-cooling radiator. The fan is disposed within the central region of the liquid-cooling radiator, and produces airflow toward the plural airflow channels.

In an embodiment, the annular wall structure of the liquid-cooling radiator has a C-shaped periphery, a corner-shaped periphery or an irregular curvy periphery.

In an embodiment, the annular wall structure of the liquid-cooling radiator has a triangular periphery, a rectangular periphery, a circular periphery, a polygonal periphery or an irregular periphery.

In an embodiment, a width of each fin close to the central region is narrower than a width of each fin away from the central region, and the plural fins are connected with each other and arranged in a radiating form.

In an embodiment, the fan is a centrifugal fan. The centrifugal fan is disposed within the central region of the liquid-cooling radiator. The centrifugal fan produces the airflow toward the plural airflow channels in a centrifugal direction.

In an embodiment, the fan is a centrifugal/axial mixed fan. The centrifugal/axial mixed fan is disposed within the central region of the liquid-cooling radiator. The centrifugal/axial mixed fan produces the airflow in a centrifugal direction and an axial direction simultaneously.

In an embodiment, the inlet and the outlet of the liquid-cooling radiator are formed in a lateral surface of the liquid-cooling radiator and arranged beside each other. The inlet and the outlet are vertically arranged in a staggered form, or the inlet and the outlet are horizontally arranged side by side.

In an embodiment, the at least one liquid passageway includes plural annular passageways. After the liquid-cooling medium is introduced into the liquid-cooling radiator through the inlet, the liquid-cooling medium is distributed into the plural annular passageways. After the liquid-cooling medium flows through the plural annular passageways for one turn and before the liquid-cooling medium flows to the outlet, the liquid-cooling medium is collected and exhausted through the outlet.

In an embodiment, the liquid-cooling radiator includes at least one flow-guiding plate. The liquid-cooling medium in the at least one liquid passageway is guided from a lower level to a higher level by the at least one flow-guiding plate.

In an embodiment, the inlet of the liquid-cooling radiator is located at a level lower than the outlet of the liquid-cooling radiator. The at least one liquid passageway between the inlet and the outlet has an upward spiral shape.

From the above descriptions, the electronic device of the present invention has the heat-dissipating function. The liquid-cooling heat dissipation module is mounted on the second circuit board. Consequently, the wind-outputting direction of the heat dissipation module is in parallel with the second circuit board. Like the second circuit board, the function circuit boards are mounted on the first circuit board. Since the path of the airflow in the wind-outputting direction is not obstructed by the function circuit boards, the efficiency of dissipating the waste heat to the surroundings of the casing is largely enhanced. Moreover, since the liquid passageway of the liquid-cooling radiator is annular, the travelling path and the residence time of the liquid-cooling medium in the liquid-cooling radiator are extended and the heat exchange efficiency is enhanced. Moreover, the fan is disposed within the central region of the liquid-cooling radiator. Since the fan produces the airflow in the centrifugal direction and/or the axial direction, the heat-dissipating efficiency is enhanced.

The above objects and advantages of the present invention will become more readily apparent to those ordinarily skilled in the art after reviewing the following detailed description and accompanying drawings, in which:

DETAILED DESCRIPTION OF THE PREFERRED EMBODIMENT

Figure 1:
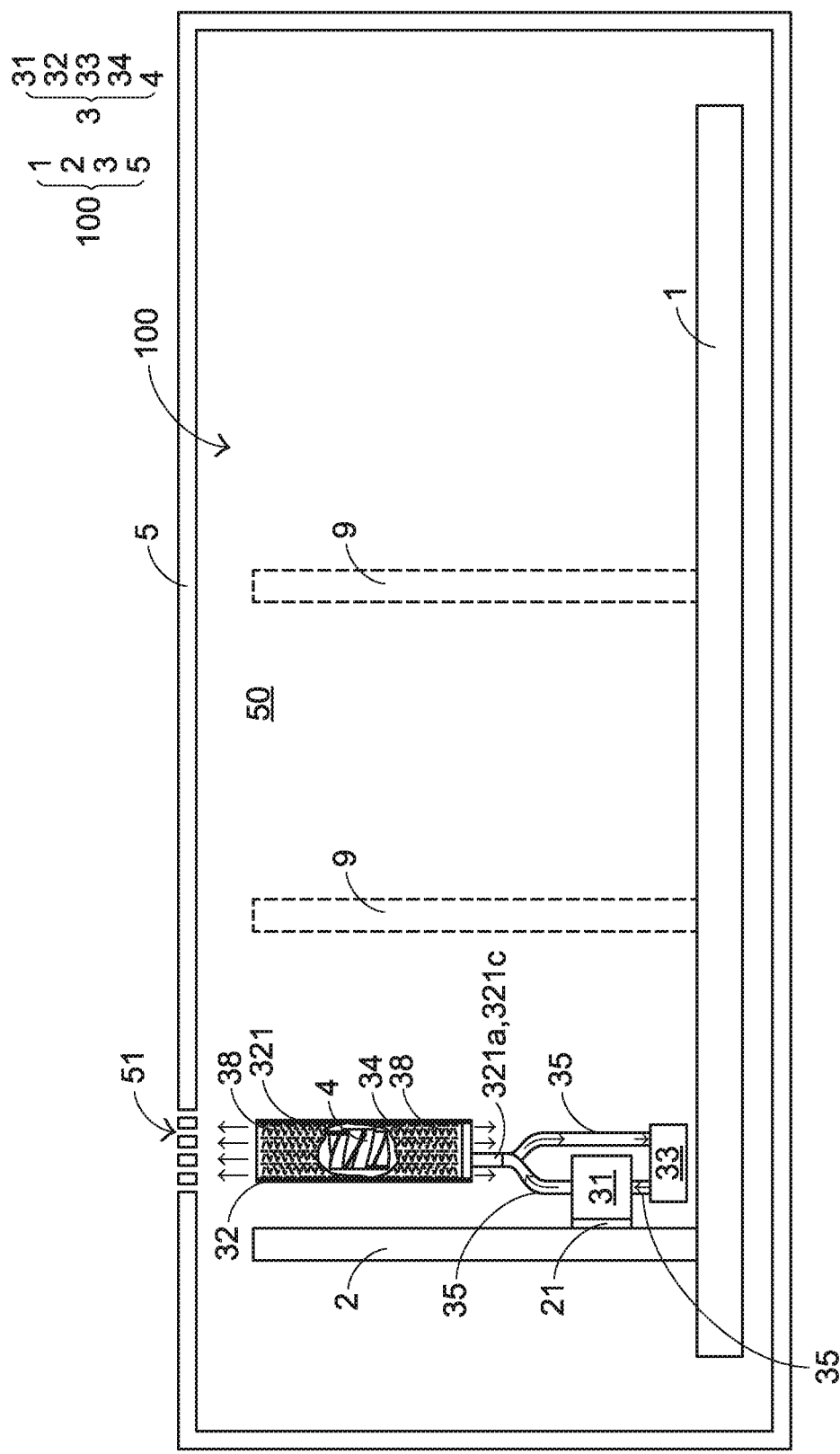
FIG. 1 is a schematic cross-sectional view illustrating an electronic device with a heat-dissipating function.

The present invention will now be described more specifically with reference to the following embodiments. It is to be noted that the following descriptions of preferred embodiments of this invention are presented herein for purpose of illustration and description only. In the following embodiments and drawings, the elements irrelevant to the concepts of the present invention are omitted and not shown. For well understanding the present invention, the elements shown in the drawings are not in scale with the elements of the practical product.

FIG. 1 is a schematic cross-sectional view illustrating an electronic device with a heat-dissipating function. As shown in FIG. 1, the electronic device 100 comprises a first circuit board 1, a second circuit board 2, a liquid-cooling heat dissipation module 3 and a casing 5. The first circuit board 1, the second circuit board 2 and the liquid-cooling heat dissipation module 3 are disposed within an accommodation space of the casing 5. Moreover, the casing 5 comprises plural ventilation holes 51. The heated airflow in the electronic device 100 is exhausted from the casing 5 through the ventilation holes 51.

In an embodiment, the second circuit board 2 is mounted on the first circuit board 1. Preferably, the second circuit board 2 is perpendicularly mounted on the first circuit board 1. The second circuit board 2 comprises an electronic component 21. During operation, the electronic component 21 generates waste heat. The electronic device 100 of the present invention has the function of dissipating the waste heat away. An example of the electronic device 100 includes but is not limited to a computer host, a server or any other appropriate electronic instrument. In an embodiment, the first circuit board 1 is a main board, the second circuit board 2 is a display card, and the electronic component 21 is a chip of the display card. It is noted that the examples of these components are not restricted.

In the electronic device 100, the liquid-cooling heat dissipation module 3 is attached on the electronic component 21 in order to effectively remove the waste heat from the electronic component 21. A liquid-cooling medium flows within the liquid-cooling heat dissipation module 3. Due to the flowing action and the physical properties of the liquid-cooling medium, the heat is effectively dissipated away. In an embodiment, the liquid-cooling heat dissipation module 3 comprises a liquid-cooling head 31, a liquid-cooling radiator 32, a liquid pump 33, plural fins 34 and a fan 4. The liquid-cooling head 31 of the liquid-cooling heat dissipation module 3 is attached on the electronic component 21 and in thermal contact with the electronic component 21. Consequently, the waste heat generated by the electronic component 21 can be quickly absorbed by the liquid-cooling head 31.

The liquid-cooling head 31, the liquid-cooling radiator 32 and the liquid pump 33 are in communication with each other through corresponding pipes 35. That is, the liquid-cooling head 31, the liquid-cooling radiator 32 and the liquid pump 33 are connected with each other in series to collaboratively define a liquid-cooling piping system. Through the liquid-cooling piping system, the liquid-cooling medium can be continuously circulated within the liquid-cooling heat dissipation module 3. The fins 34 are connected with and thermally contacted with the liquid-cooling radiator 32. Since the fins 34 have large contact areas with respect to the air, the heat from the liquid-cooling radiator 32 can be radiated to the surroundings through the fins 34.

Figure 2:
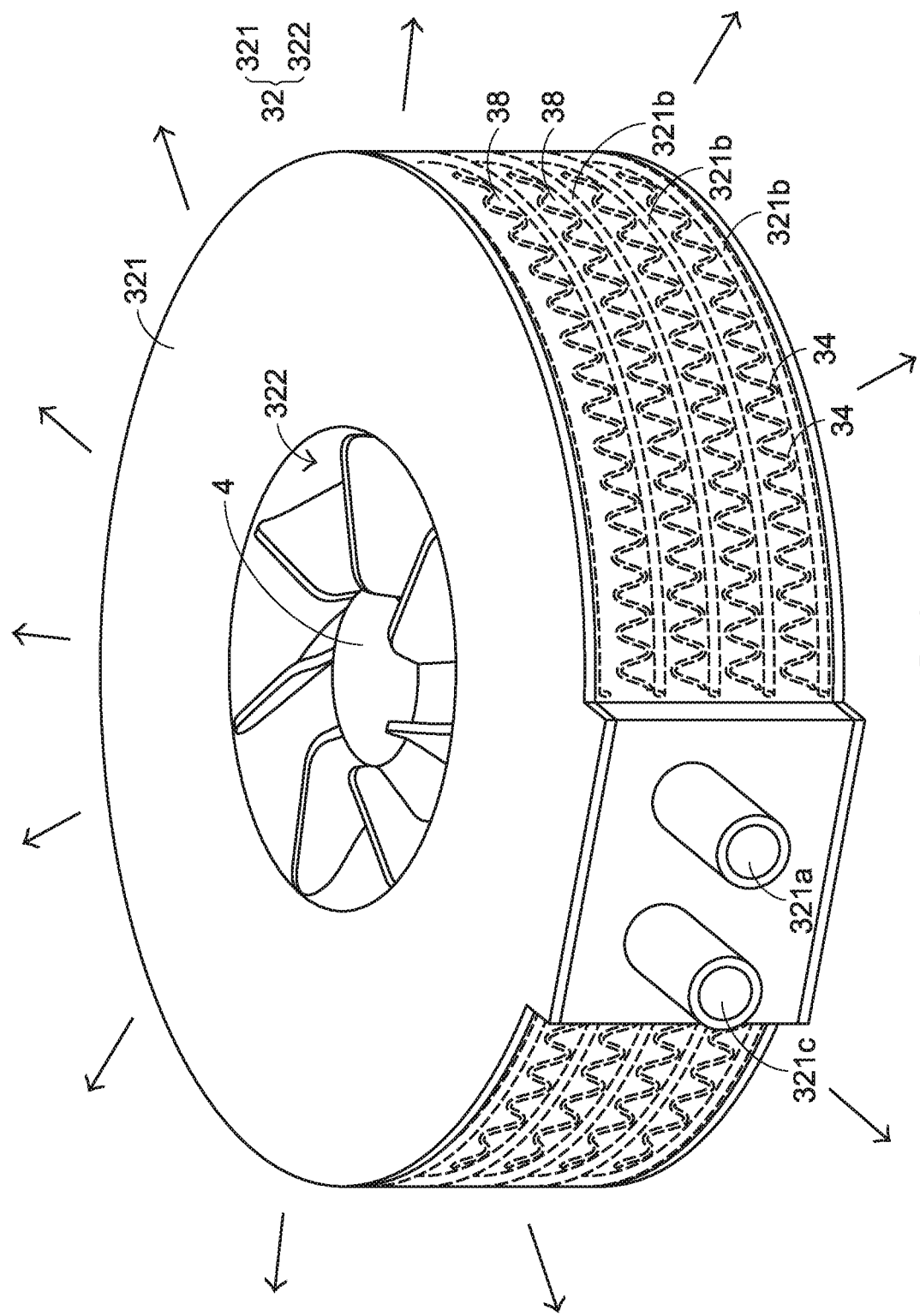
FIG. 2 is a schematic perspective view illustrating the combination of the liquid-cooling radiator, the fins and the fan of the electronic device according to a first embodiment of the present invention.
Figure 3:
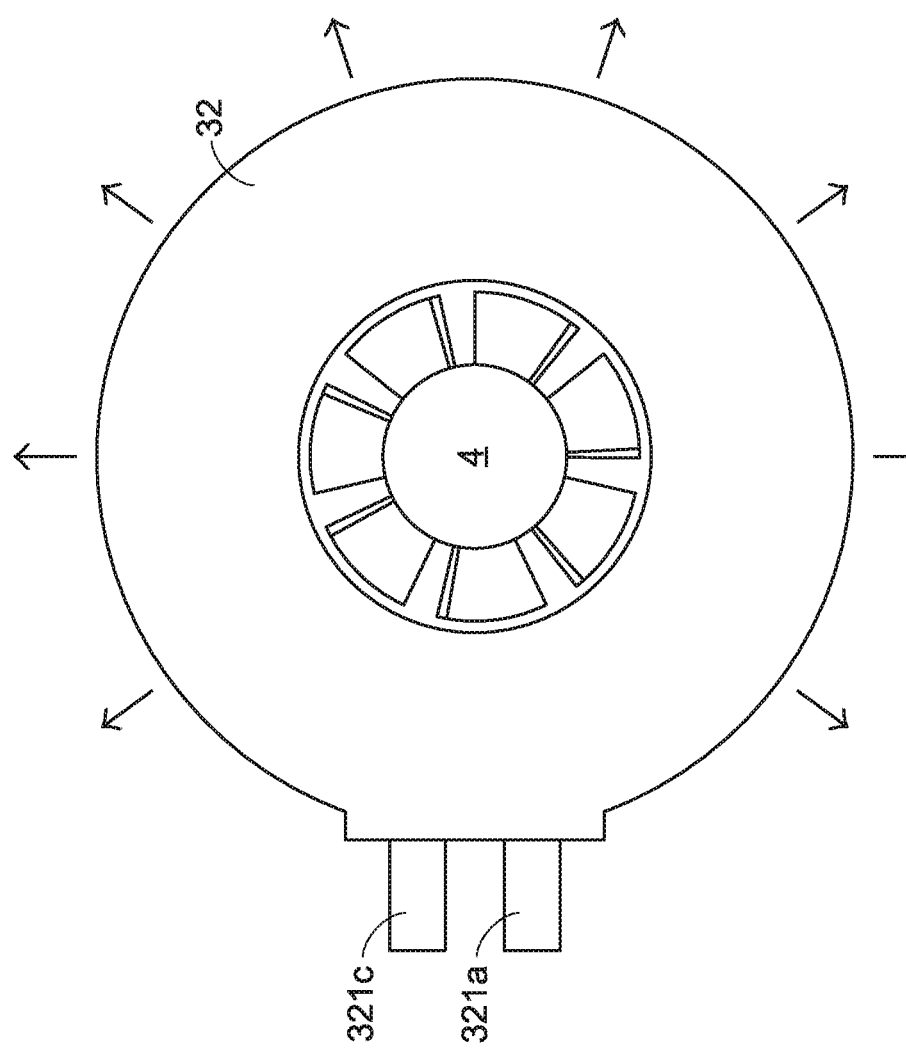
FIG. 3 is a schematic top view illustrating the combination of the liquid-cooling radiator, the fins and the fan of the electronic device as shown in FIG. 2.
Figure 4:
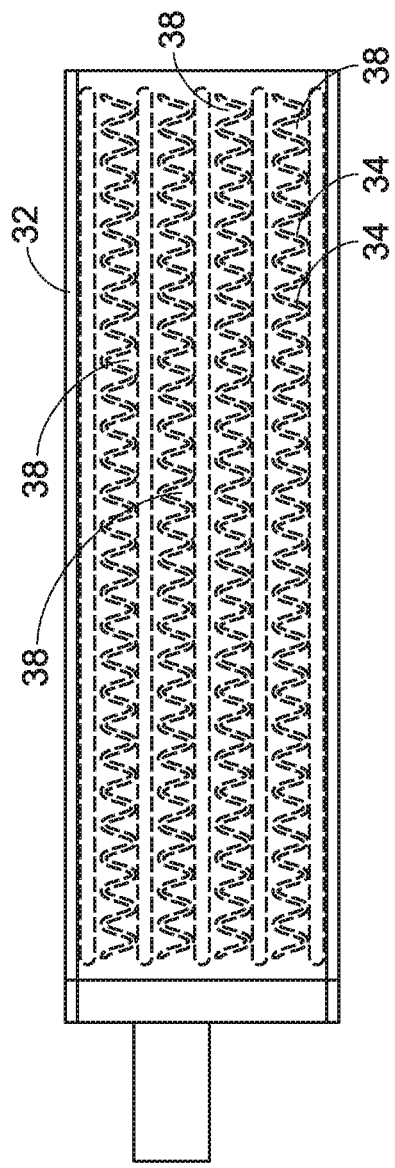
FIG. 4 is a schematic side view illustrating the liquid-cooling radiator of the electronic device as shown in FIG. 2.

FIG. 2 is a schematic perspective view illustrating the combination of the liquid-cooling radiator, the fins and the fan of the electronic device according to a first embodiment of the present invention. FIG. 3 is a schematic top view illustrating the combination of the liquid-cooling radiator, the fins and the fan of the electronic device as shown in FIG. 2. FIG. 4 is a schematic side view illustrating the liquid-cooling radiator of the electronic device as shown in FIG. 2. Please refer to FIGS. 1, 2, 3 and 4. In the liquid-cooling heat dissipation module 3, plural airflow channels 38 (see FIG. 4) are defined by an annular wall structure 321 of the liquid-cooling radiator 32 and the fins 34 collaboratively. The plural airflow channels 38 are in parallel with the second circuit board 2. The fan 4 is arranged beside the liquid-cooling radiator 32. The fan 4 is used for producing airflow and guiding the airflow toward the airflow channels 38. After the airflow is introduced into the airflow channels 38, the airflow is guided in the direction parallel with the second circuit board 2. Since the second circuit board 2 is perpendicularly mounted on the first circuit board 1, an annular airflow channel group is defined by the plural airflow channels 38 collaboratively. After the airflow produced by the fan 4 is introduced into the annular airflow channel group, the airflow is outputted from an annular wind-outputting surface. The annular wind-outputting surface is perpendicular to the first circuit board 1.

Moreover, plural function circuit boards 9 are mounted on the first circuit board 1 in parallel and arranged side by side. The mounting direction of the function circuit boards 9 is the same as the mounting direction of the second circuit board 2. That is, the function circuit boards 9 are in parallel with the second circuit board 2. Since the wind-outputting direction of the liquid-cooling heat dissipation module 3 is in parallel with the second circuit board 2, the wind-outputting direction of the liquid-cooling heat dissipation module 3 is also in parallel with the function circuit boards 9. Consequently, when the fan 4 produces the airflow toward the liquid-cooling radiator 32 to remove the heat from the electronic component 21 of the second circuit board 2, the path of the airflow is not obstructed by the function circuit boards 9. Since the airflow within the casing 5 is not obstructed by the function circuit boards 9, the waste heat can be carried by the airflow and quickly exhausted to surroundings through the ventilation holes 51 of the casing 5.

The liquid-cooling radiator 32 comprises the annular wall structure 321 and a central region 322. The annular wall structure 321 is arranged around the central region 322. The annular wall structure 321 of the liquid-cooling radiator 32 comprises at least one liquid passageway 321b, an inlet 321a and an outlet 321c. The inlet 321a and the outlet 321c are located at two ends of the at least one liquid passageway 321b, respectively. After the waste heat generated by the electronic component 21 is absorbed by the liquid-cooling medium, the temperature of the liquid-cooling medium is increased. The liquid-cooling medium with the increased temperature is introduced into the at least one liquid passageway 321b through the inlet 321a. While the liquid-cooling medium flows within the at least one liquid passageway 321b, the absorbed heat of the liquid-cooling medium is gradually transferred to the outer side of the at least one liquid passageway 321b, for example transferred to the fins 34. Since the absorbed heat of the liquid-cooling medium is gradually reduced, the temperature of the liquid-cooling medium is decreased. The liquid-cooling medium with the decreased temperature is outputted from the outlet 321c.

Please refer to FIGS. 1 and 2. The operating principles will be described as follows. After the waste heat generated by the electronic component 21 is absorbed by the liquid-cooling medium in the liquid-cooling head 31, the temperature of the liquid-cooling medium is increased and the liquid-cooling medium with the increased temperature is introduced into the at least one liquid passageway 321b of the liquid-cooling radiator 32 through the inlet 321a. The absorbed heat of the liquid-cooling medium is transferred from the liquid-cooling radiator 32 to the fins 34, which are connected with the liquid-cooling radiator 32. Then, the heat of the liquid-cooling medium is quickly radiated to the surroundings through the fins 34. Consequently, the temperature of the liquid-cooling medium is decreased. Then, the liquid-cooling medium with the decreased temperature is outputted from the at least one liquid passageway 321b to the liquid pump 33 through the outlet 321c. Then, the liquid-cooling medium with the decreased temperature is propelled to the liquid-cooling head 31. The above circulating heat-dissipating process is repeatedly done.

Figure 8:
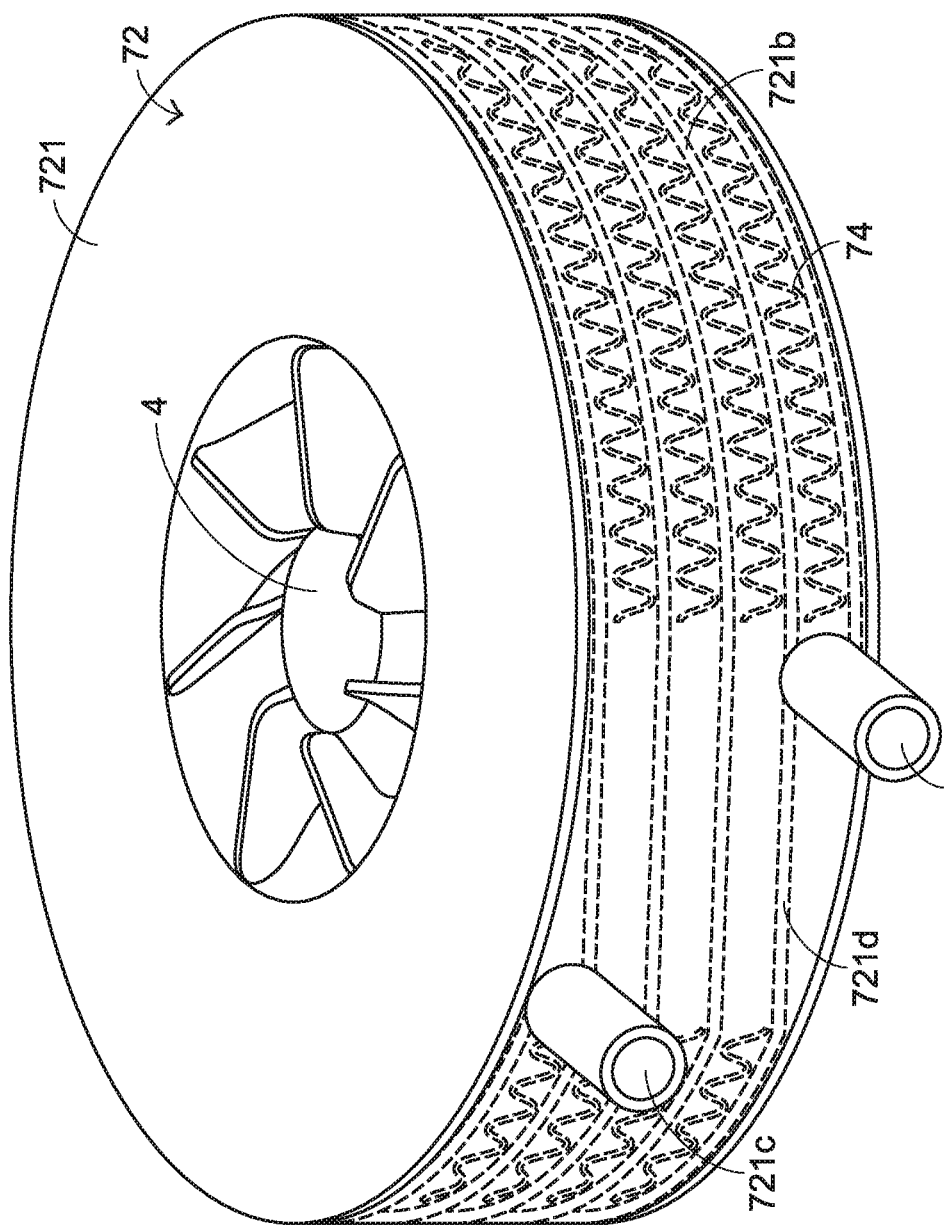
FIG. 8 is a schematic perspective view illustrating the combination of the liquid-cooling radiator, the fins and the fan of the electronic device according to a third embodiment of the present invention.
Figure 9:
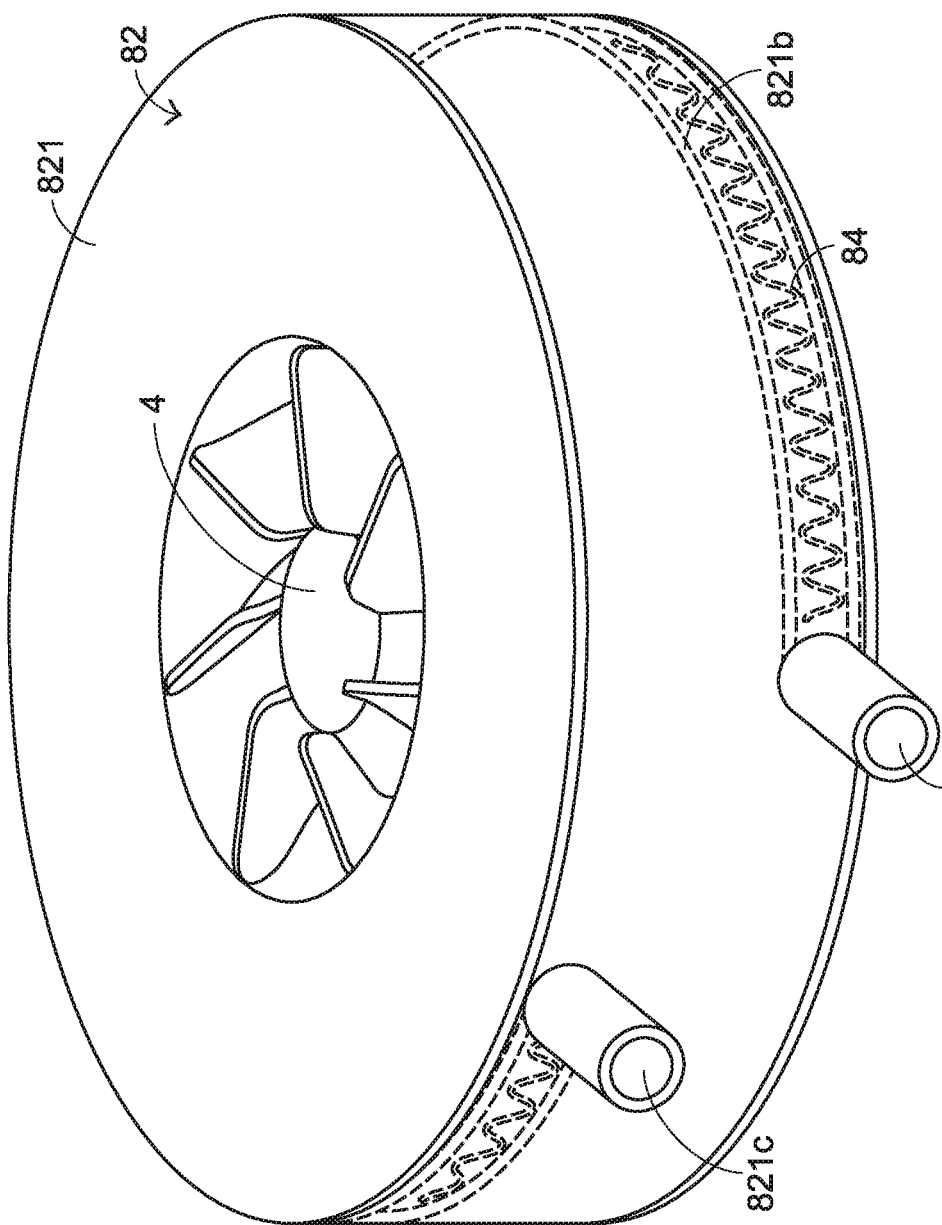
FIG. 9 is a schematic perspective view illustrating the combination of the liquid-cooling radiator, the fins and the fan of the electronic device according to a fourth embodiment of the present invention.

Please refer to FIGS. 2, 3 and 4. For increasing the space utilization of the liquid-cooling heat dissipation module 3, the liquid-cooling radiator 32 has the annular and flat appearance. Since the inlet 321a and the outlet 321c have volumes, it is preferred that the inlet 321a and the outlet 321c are formed in a lateral surface of the liquid-cooling radiator 32 and arranged beside each other. The inlet 321a and the outlet 321c open to the outside along the centrifugal direction of the liquid-cooling radiator 32. Consequently, when the liquid-cooling radiator 32 is in communication with the pipe 35, the occupied space of the liquid-cooling radiator 32 is still flat. That is, the height of the layout space is not increased. In the embodiment of FIG. 2, the inlet 321a and the outlet 321c are horizontally arranged side by side. It is noted that the relative positions of the inlet 321a and the outlet 321c are not restricted. For example, in the embodiment as shown in FIG. 8, the inlet 721a and the outlet 721c are vertically arranged in a staggered form. Similarly, in the embodiment as shown in FIG. 9, the inlet 821a and the outlet 821c are vertically arranged in a staggered form. In comparison with the horizontal side-by-side arrangement, the vertical staggered arrangement of the inlet and the outlet provides an additional space for assembling associated components.

In an embodiment, the annular wall structure 321 is an encircled structure with a circular periphery. Alternatively, the annular wall structure 321 is an encircled structure with a rectangular periphery, a triangular periphery, a polygonal periphery or an irregular periphery. Alternatively, the annular wall structure 321 has a gap. For example, the annular wall structure 321 has a C-shaped periphery (see FIG. 7), a corner-shaped periphery or an irregular curvy periphery.

In the first embodiment, the two ends of the annular wall structure 321 of the liquid-cooling radiator 32 are connected with each other. Moreover, the annular wall structure 321 has a circular periphery. Moreover, the at least one liquid passageway 321b comprises five annular passageways 321b. After the liquid-cooling medium with the higher temperature is introduced into the liquid-cooling radiator 32 through the inlet 321a, the liquid-cooling medium is distributed upwardly or downwardly into the five annular passageways 321b. After the liquid-cooling medium flows through the five annular passageways for one turn and before the liquid-cooling medium flows to the outlet 321c, the five portions of the liquid-cooling medium from the five annular passageways are collected. Then, the liquid-cooling medium is exhausted to the liquid pump 33 through the outlet 321c.

Figure 5:
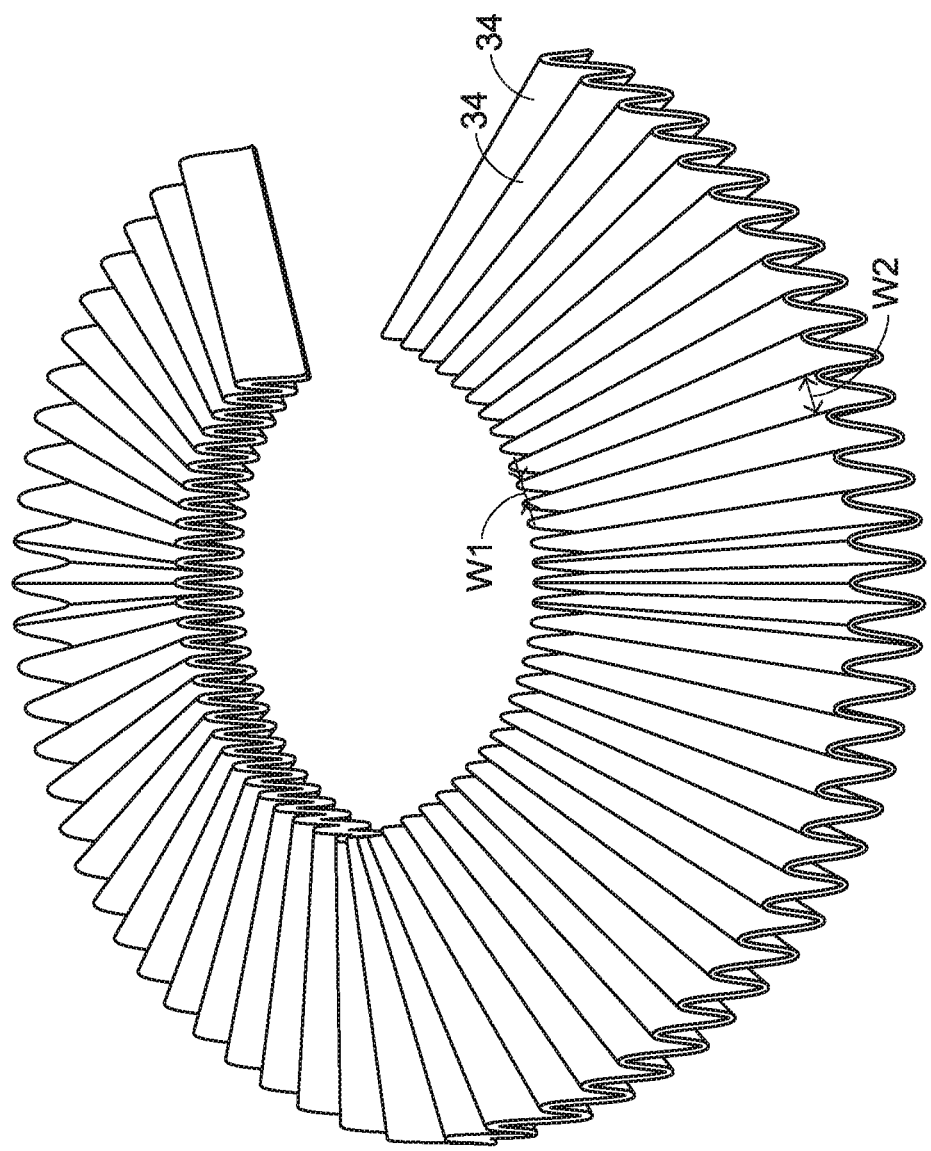
FIG. 5 is a schematic perspective view illustrating plural fins of the liquid-cooling heat dissipation module of the electronic device according to the embodiment of the present invention.

The structures of the fins 34 will be illustrated with reference to FIGS. 1, 2, 4 and 5. FIG. 5 is a schematic perspective view illustrating plural fins of the liquid-cooling heat dissipation module of the electronic device according to the embodiment of the present invention. In this embodiment, the fins 34 have wavy structures. These wavy fins 34 are connected with each other in an annular arrangement. Moreover, a chamber with the inlet 321a and the outlet 321c of the liquid-cooling radiator 32 is accommodated within a gap between the two terminal fins 34. For succinctness, the chamber is not shown in FIG. 5. Due to the gap, the fins 34 can be assembled with the liquid-cooling radiator 32. It is noted that the types of the fins 34 may be varied according to the structure of the liquid-cooling radiator 32. Preferably, there are plural layers of fins 34 in the annular arrangement. Each layer of fins 34 is arranged between two adjacent annular passageways 321b in the vertical direction and contacted with the two annular passageways 321b. Consequently, the efficacy of transferring the heat is enhanced, and the heat-dissipating efficiency is increased.

As shown in FIG. 5, the width W1 of each fin 34 close to the central region 322 is narrower than the width W2 of each fin 34 away from the central region 322. From the top view, it is found that the fins 34 are connected with each other in the annular arrangement and in a radiating form.

Figure 6:
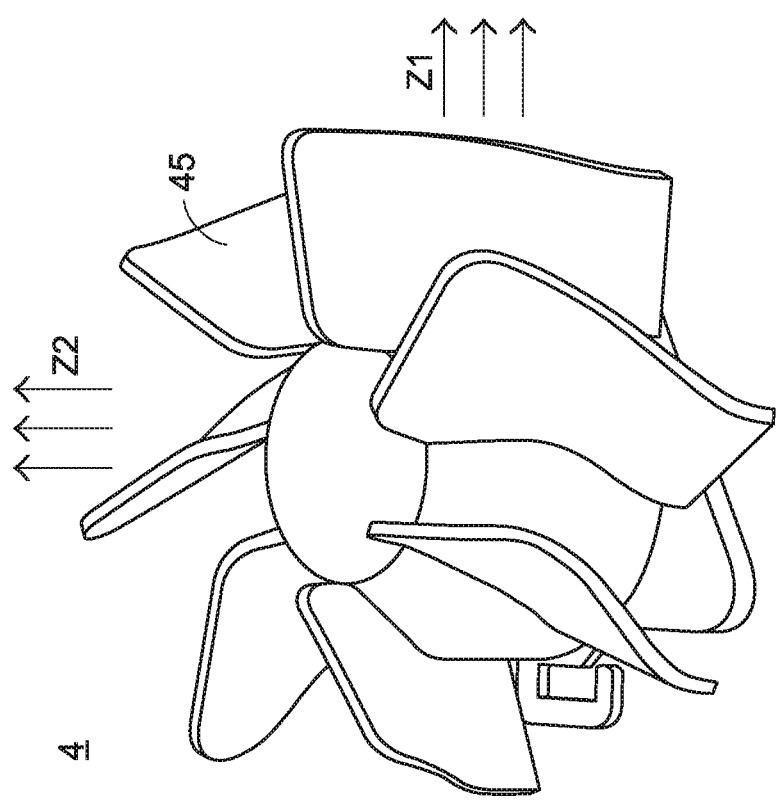
FIG. 6 is a schematic perspective view illustrating the fan of the electronic device according to the embodiment of the present invention.

The function of the fan 4 will be described as follows. The fan 4 is disposed within the central region 322 of the liquid-cooling radiator 32. In an embodiment, the fan 4 is a centrifugal fan. The centrifugal fan is capable of producing the airflow at 360 degrees. Preferably, the blades 45 of the fan 4 have special design as shown in FIG. 6. FIG. 6 is a schematic perspective view illustrating the fan of the electronic device according to the embodiment of the present invention. In this embodiment, the fan 4 is a centrifugal/axial mixed fan. The centrifugal/axial mixed fan is disposed within the central region 322 of the liquid-cooling radiator 32. Moreover, the centrifugal/axial mixed fan produces airflow in a centrifugal direction and an axial direction simultaneously. The blades 45 are arranged in a radiating form. Each blade 45 has an S-shape curvy profile. Consequently, the fan 4 produces the airflow in the centrifugal direction Z1 (i.e., the direction in parallel with the second circuit board 2) and the axial direction Z2 (i.e., the direction perpendicular to the second circuit board 2). Since the airflow is generated in the centrifugal direction Z1 and the axial direction Z2 simultaneously, the heat-dissipating efficiency in convection is enhanced. In this context, the liquid-cooling radiator, the fins and the fan are modularized as a liquid-cooling radiator module.

In another embodiment, the fan 4 is a centrifugal fan. The centrifugal fan is disposed within the central region 322 of the liquid-cooling radiator 32. The centrifugal fan produces the airflow toward the plural airflow channels 38 in the centrifugal direction (i.e., the direction in parallel with the second circuit board 2). That is, the airflow is guided in the direction in parallel with the second circuit board 2.

Figure 7:
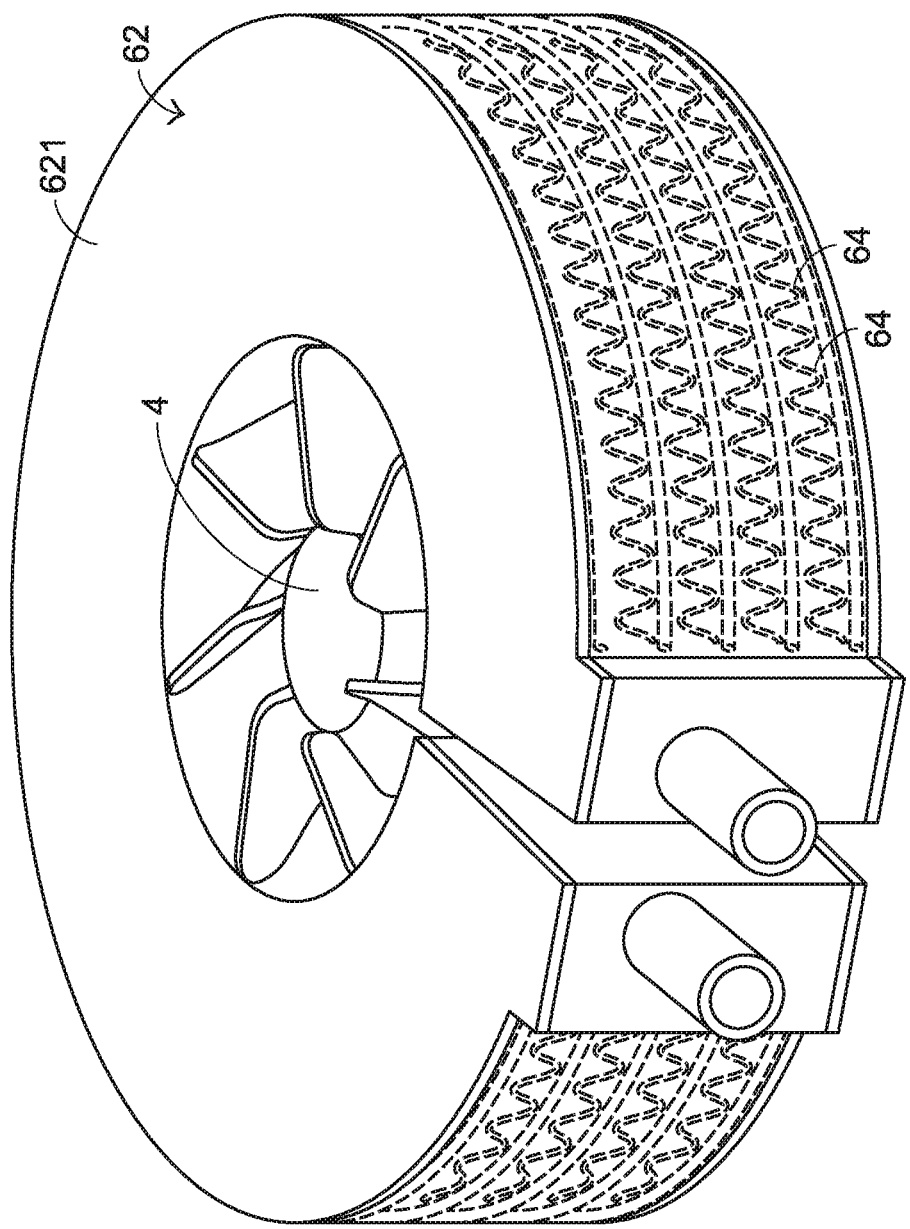
FIG. 7 is a schematic perspective view illustrating the combination of the liquid-cooling radiator, the fins and the fan of the electronic device according to a second embodiment of the present invention.

FIG. 7 is a schematic perspective view illustrating the combination of the liquid-cooling radiator, the fins and the fan of the electronic device according to a second embodiment of the present invention. In this embodiment, a liquid-cooling radiator 62, plural fins 64 and a fan 4 are collaboratively formed as a liquid-cooling radiator module. The functions and structures of the fins 64 and the fan 4 of this embodiment are similar to those of the first embodiment, and are not redundantly described herein. In comparison with the first embodiment, the two ends of the annular wall structure 621 of the liquid-cooling radiator 62 are not connected with each other. Under this circumstance, the annular wall structure 621 has a gap. In other words, the annular wall structure 621 has a C-shaped periphery.

FIG. 8 is a schematic perspective view illustrating the combination of the liquid-cooling radiator, the fins and the fan of the electronic device according to a third embodiment of the present invention. In this embodiment, a liquid-cooling radiator 72, plural fins 74 and a fan 4 are collaboratively formed as a liquid-cooling radiator module. The functions and structures of the fins 74 and the fan 4 of this embodiment are similar to those of the first embodiment, and are not redundantly described herein. In comparison with the first embodiment, the inlet 721a and the outlet 721c of the annular wall structure 721 of the liquid-cooling radiator 72 in this embodiment are vertically arranged in a staggered form. Moreover, the liquid-cooling radiator 72 comprises at least one flow-guiding plate 721d. Due to the at least one flow-guiding plate 721d, the liquid-cooling medium in the at least one liquid passageway is guided from a lower level to a higher level. In other words, the liquid-cooling medium in the at least one liquid passageway is guided along an upward spiral path. The use of the flow-guiding plate has benefits. For example, the travelling path of the liquid-cooling medium in the liquid-cooling radiator 72 becomes longer and the residence time of the liquid-cooling medium is prolonged. Consequently, the heat exchange efficacy is further enhanced.

FIG. 9 is a schematic perspective view illustrating the combination of the liquid-cooling radiator, the fins and the fan of the electronic device according to a fourth embodiment of the present invention. In this embodiment, a liquid-cooling radiator 82, plural fins 84 and a fan 4 are collaboratively formed as a liquid-cooling radiator module. The functions and structures of the fins 84 and the fan 4 of this embodiment are similar to those of the first embodiment, and are not redundantly described herein. In comparison with the first embodiment, the inlet 821a and the outlet 821c of the annular wall structure 821 of the liquid-cooling radiator 82 in this embodiment are vertically arranged in a staggered form. Moreover, the at least one liquid passageway between the inlet 821a and the outlet 821c has an upward spiral shape. Since the residence time of the liquid-cooling medium in the at least one liquid passageway is prolonged, the heat exchange efficacy is enhanced. In this embodiment, two liquid passageways 821b are shown in FIG. 9. The fins 84 are arranged between the two liquid passageways 821b. The structures of the fins 84 may be varied according to the shape of the at least one liquid passageway 821b. It is noted that the numbers and positions of the at least one liquid passageway 821b and the fins 84 may be varied according to the practical requirements.

From the above descriptions, the electronic device of the present invention has the heat-dissipating function. The liquid-cooling heat dissipation module is mounted on the second circuit board. Consequently, the wind-outputting direction of the heat dissipation module is in parallel with the second circuit board. Like the second circuit board, the function circuit boards are mounted on the first circuit board. Since the path of the airflow in the wind-outputting direction is not obstructed by the function circuit boards, the efficiency of dissipating the waste heat to the surroundings of the casing is largely enhanced. Moreover, since the liquid passageway of the liquid-cooling radiator is annular, the travelling path and the residence time of the liquid-cooling medium in the liquid-cooling radiator are extended and the heat exchange efficiency is enhanced. Moreover, the fan is disposed within the central region of the liquid-cooling radiator. Since the fan produces the airflow in the centrifugal direction and/or the axial direction, the heat-dissipating efficiency is enhanced.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all modifications and similar structures.

What is claimed is:
1. An electronic device with a heat-dissipating function, the electronic device comprising:
a first circuit board;
a second circuit board mounted on the first circuit board, wherein the second circuit board comprises an electronic component; and
a liquid-cooling heat dissipation module, wherein a liquid-cooling medium flows within the liquid-cooling heat dissipation module to dissipate heat, and the liquid-cooling heat dissipation module comprises:
a liquid-cooling head in thermal contact with the electronic component of the second circuit board;
a liquid-cooling radiator module comprising a liquid-cooling radiator, plural wavy fins and a fan, wherein the liquid-cooling radiator is in communication with the liquid-cooling head and comprises an annular wall structure, and the annular wall structure comprises an inlet, an outlet and plural liquid annular passageways connected between the inlet and the outlet, wherein the liquid-cooling medium from the liquid-cooling head is introduced into the liquid-cooling radiator through the inlet and then exhausted through the outlet, wherein each of the wavy fins is disposed between two adjacent of the plural liquid annular passageways, and crests and troughs of each of the wavy fins are adjacent to or in contact with two adjacent of the plural liquid annular passageways, wherein the liquid-cooling radiator further comprises a central region, and the annular wall structure is arranged around the central region, wherein a width of two adjacent of the crests of one of the wavy fins close to the central region is narrower than a width of the two adjacent of the crests of the one of the wavy fins away from the central region, wherein plural airflow channels are defined by the plural wavy fins and the annular wall structure collaboratively, and the plural airflow channels are in parallel with the second circuit board, wherein the fan is arranged beside the liquid-cooling radiator, and the fan produces airflow toward the plural airflow channels; and
a liquid pump in communication with the liquid-cooling radiator, wherein the liquid-cooling medium from the outlet of the liquid-cooling radiator is sucked into the liquid pump, and the liquid-cooling medium is propelled from the liquid pump to the liquid-cooling radiator.

2. The electronic device according to claim 1, wherein the annular wall structure of the liquid-cooling radiator has a C-shaped periphery, a corner-shaped periphery or an irregular curvy periphery.

3. The electronic device according to claim 1, wherein the annular wall structure of the liquid-cooling radiator is an encircled structure with a triangular periphery, a rectangular periphery, a circular periphery, a polygonal periphery or an irregular periphery.

4. The electronic device according to claim 1, wherein the fan is a centrifugal fan, wherein the centrifugal fan is disposed within the central region of the liquid-cooling radiator, and the centrifugal fan produces the airflow toward the plural airflow channels in a centrifugal direction.

5. The electronic device according to claim 1, wherein the fan is a centrifugal/axial mixed fan, wherein the centrifugal/axial mixed fan is disposed within the central region of the liquid-cooling radiator, and the centrifugal/axial mixed fan produces the airflow in a centrifugal direction and an axial direction simultaneously.

6. The electronic device according to claim 5, wherein the centrifugal/axial mixed fan comprises plural blades, and each of the plural blades has an S-shape curvy profile.

7. The electronic device according to claim 1, wherein the inlet and the outlet of the liquid-cooling radiator are formed in a lateral surface of the liquid-cooling radiator and arranged beside each other, wherein the inlet and the outlet are vertically arranged in a staggered form, or the inlet and the outlet are horizontally arranged side by side.

8. The electronic device according to claim 1, wherein after the liquid-cooling medium is introduced into the liquid-cooling radiator through the inlet, the liquid-cooling medium is distributed into the plural annular passageways, wherein after the liquid-cooling medium flows through the plural annular passageways for one turn and before the liquid-cooling medium flows to the outlet, the liquid-cooling medium is collected, and the liquid-cooling medium is then exhausted through the outlet.

9. The electronic device according to claim 8, wherein the liquid-cooling radiator comprises at least one flow-guiding plate, and the liquid-cooling medium in at least one liquid annular passageway of the plural liquid annular passageways is guided from a lower level to a higher level by the at least one flow-guiding plate.

10. The electronic device according to claim 1, wherein the inlet of the liquid-cooling radiator is located at a level lower than the outlet of the liquid-cooling radiator, and the plural liquid annular passageways between the inlet and the outlet have an upward spiral shape.

11. A liquid-cooling radiator module for allowing a liquid-cooling medium to flow through to dissipate heat, the liquid-cooling radiator module comprising:
  a liquid-cooling radiator comprising an annular wall structure and a central region, wherein the annular wall structure is arranged around the central region, and the annular wall structure comprises an inlet, an outlet and plural liquid annular passageways connected between the inlet and the outlet, wherein the liquid-cooling medium is introduced into the liquid-cooling radiator through the inlet and then exhausted through the outlet;
  plural wavy fins connected with the liquid-cooling radiator, wherein plural airflow channels are defined by the plural wavy fins and the annular wall structure collaboratively, and the plural airflow channels are arranged in a radiating form in a centrifugal direction away from the central region of the liquid-cooling radiator, and each of the wavy fins is disposed between two adjacent of the plural liquid annular passageways, and crests and troughs of each of the wavy fins are adjacent to or in contact with two adjacent of the plural liquid annular passageways, wherein a width of two adjacent of the crests of one of the wavy fins close to the central region is narrower than a width of the two adjacent of the crests of the one of the wavy fins away from the central region; and
  a fan disposed within the central region of the liquid-cooling radiator, and producing airflow toward the plural airflow channels.

12. The liquid-cooling radiator module according to claim 11, wherein the annular wall structure of the liquid-cooling radiator has a C-shaped periphery, a corner-shaped periphery or an irregular curvy periphery.

13. The liquid-cooling radiator module according to claim 11, wherein the annular wall structure of the liquid-cooling radiator is an encircled structure with a triangular periphery, a rectangular periphery, a circular periphery, a polygonal periphery or an irregular periphery.

14. The liquid-cooling radiator module according to claim 11, wherein the fan is a centrifugal fan, wherein the centrifugal fan is disposed within the central region of the liquid-cooling radiator, and the centrifugal fan produces the airflow toward the plural airflow channels in a centrifugal direction.

15. The liquid-cooling radiator module according to claim 11, wherein the fan is a centrifugal/axial mixed fan, wherein the centrifugal/axial mixed fan is disposed within the central region of the liquid-cooling radiator, and the centrifugal/axial mixed fan produces the airflow in a centrifugal direction and an axial direction simultaneously.

16. The liquid-cooling radiator module according to claim 11, wherein the inlet and the outlet of the liquid-cooling radiator are formed in a lateral surface of the liquid-cooling radiator and arranged beside each other, wherein the inlet and the outlet are vertically arranged in a staggered form, or the inlet and the outlet are horizontally arranged side by side.

17. The liquid-cooling radiator module according to claim 11, wherein after the liquid-cooling medium is introduced into the liquid-cooling radiator through the inlet, the liquid-cooling medium is distributed into the plural annular passageways, wherein after the liquid-cooling medium flows through the plural annular passageways for one turn and before the liquid-cooling medium flows to the outlet, the liquid-cooling medium is collected, and the liquid-cooling medium is then exhausted through the outlet.

18. The liquid-cooling radiator module according to claim 11, wherein the liquid-cooling radiator comprises at least one flow-guiding plate, and the liquid-cooling medium in at least one liquid annular passageway of the plural liquid annular passageways is guided from a lower level to a higher level by the at least one flow-guiding plate.

19. The liquid-cooling radiator module according to claim 11, wherein the inlet of the liquid-cooling radiator is located at a level lower than the outlet of the liquid-cooling radiator, and the plural liquid annular passageways between the inlet and the outlet have an upward spiral shape.

* * * * *